United States Patent [19]
Jin et al.

[11] Patent Number: 5,618,611
[45] Date of Patent: Apr. 8, 1997

[54] METALLIZATION OF FERRITES THROUGH SURFACE REDUCTION

[75] Inventors: Sungho Jin, Millington; Henry H. Law, Berkeley Heights; Thomas H. Tiefel, North Plainfield; Te-Sung Wu, New Providence, all of N.J.

[73] Assignee: Lucent Technologies Inc., Murray Hill, N.J.

[21] Appl. No.: 428,283

[22] Filed: Apr. 25, 1995

Related U.S. Application Data

[63] Continuation of Ser. No. 268,487, Jun. 30, 1994, abandoned.

[51] Int. Cl.⁶ .................................................. B32B 9/00
[52] U.S. Cl. ...................... 428/209; 428/457; 428/472.2; 428/615
[58] Field of Search ................................. 428/209, 457, 428/472.2, 901

[56] References Cited

U.S. PATENT DOCUMENTS

| | | | |
|---|---|---|---|
| 3,647,519 | 3/1972 | White | 117/71 |
| 3,881,038 | 4/1975 | Bondley | 427/156 |
| 3,900,305 | 8/1975 | DeLuca | 65/30 |
| 3,935,548 | 1/1976 | Rosenbaum et al. | 333/1.1 |
| 4,447,501 | 5/1984 | Shigeru et al. | 428/570 |
| 4,663,826 | 5/1987 | Baeuerle | 29/571 |
| 4,713,300 | 12/1987 | Sowman et al. | 428/547 |
| 4,847,138 | 7/1989 | Boylan | 428/209 |
| 5,029,242 | 7/1991 | Sammet | 174/257 |
| 5,091,820 | 2/1992 | Iwaya et al. | 361/304 |
| 5,122,227 | 6/1992 | Ott | 156/659.1 |

Primary Examiner—Patrick Ryan
Assistant Examiner—Kam F. Lee
Attorney, Agent, or Firm—John M. Harman

[57] ABSTRACT

The present invention provides a method for metallizing a ceramic surface comprising a ferrite through a surface reduction treatment. A ceramic surface comprising a ferrite is heated. At least a portion of the ferrite is contacted with a gaseous reducing agent to create a metallic region by removing oxygen from the ferrite. The surface is cooled and, optionally, post-treated to enhance adhesion of the metallic region. Typical gaseous reducing agents are hydrogen, forming gas, and ammonia while typical ferrites are nickel-zinc ferrites and manganese-zinc ferrites. To form patterned regions, portions of the substrate are masked or portions of the reduced layer are removed.

7 Claims, 5 Drawing Sheets

|←—4mm—→|

METALLIZATION OF FERRITES THROUGH SURFACE REDUCTION

This application is a continuation of application Ser. No. 08/268487, filed on Jun. 30, 1994, now abandoned.

BACKGROUND OF THE INVENTION

1. Field of the Invention

The invention relates to metallization of ferrites and, more particularly, to metallization of ferrites by surface reduction with a gaseous reducing agent.

2. Description of the Related Art

Ferrites, a class of oxide ceramic materials based on $Fe_2O_3$, have a variety of useful electrical and magnetic properties which make them attractive for devices such as inductors and transformers. Metallization of ferrite surfaces is often needed to prepare electrically conductive paths for circuit elements. Strong adhesion of the metallized layer is desirable for device durability and reliability. When further processing is required following metallization, adhesion of the metallized layer the ferrite must be sufficiently high to withstand the additional stress induced, e.g., by processes such as baking or electroplating.

Generally, ceramic metallization processes fall into three categories: thin-film, thick-film, and co-firing techniques. In the thin film approach, a thin layer of metal is deposited by vacuum processes such as sputtering, evaporation, chemical vapor deposition, and laser ablation. Electroless and electrolytic plating are also frequently grouped in the thin film category. To enhance adhesion, a preliminary adhesion-promoting layer, such as chromium or titanium, is often deposited.

Thick film methods involve screen printing metal pastes, typically metal powders mixed with glass frits and organic binders, onto ceramic substrates. The printed substrates are fired to form conductive paths on the ceramic. In the co-firing approach, unfired "green" ceramic substrates are coated with patterned metal paste lines. The printed green substrate is fired both to sinter the substrate and form the conductive metal patterns.

These processes have several disadvantages. Thin film techniques such as sputtering and electron-beam evaporation require vacuum deposition equipment. Thick film and co-firing methods generally employ precious metals such as silver and/or palladium. High temperature processing causes dimensional changes and can create stresses due to differing coefficients of thermal expansion for printed substrates containing dissimilar materials.

Other approaches to ceramic metallization are disclosed in U.S. Pat. Nos. 4,663,826 and 5,091,820. In the '826 patent, a region of increased conductivity is generated by laser irradiation in a reducing atmosphere. In the '820 patent, electrodes are formed on opposing faces of a piezo-electric cylinder through reduction followed by selective removal of reduced layer portions.

In view of the difficulties and high costs associated with conventional metallization processes, there is need in the art for simple, low-temperature processes to create conductive paths on ceramic substrates. More particularly, there is a need in the art to create adherent metallization on ferrite surfaces to define circuit elements and magnetic component elements for ferrite devices.

SUMMARY OF THE INVENTION

The present invention provides a method for metallizing a ceramic surface comprising a ferrite through a surface reduction treatment. A ceramic surface comprising a ferrite is heated. At least a portion of the ferrite is contacted with a gaseous reducing agent to create a metallic region by removing oxygen from the ferrite. The surface is cooled and, optionally, post-treated to enhance adhesion of the metallic region. Typical gaseous reducing agents are hydrogen, forming gas, and mixtures thereof, while typical ferrites are nickel-zinc ferrites and manganese-zinc ferrites. To form patterned regions, portions of the substrate are masked or portions of the reduced surface layer are removed.

DETAILED DESCRIPTION

Figure 1:
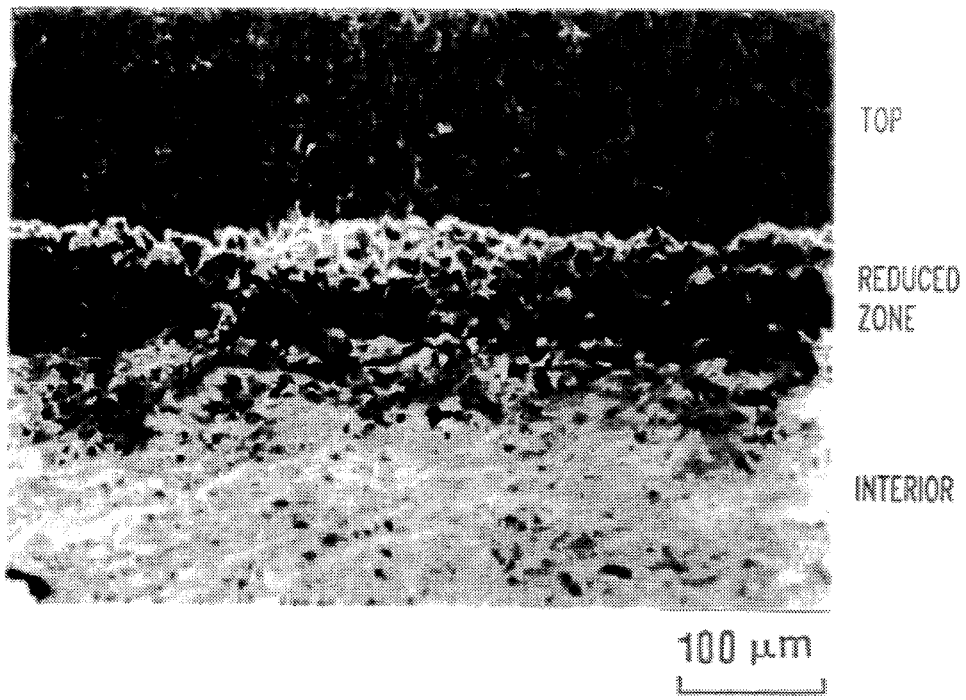
FIG. 1 is a scanning electron photomicrograph of a hydrogen-reduced Ni-Zn ferrite sample in cross-section taken at 200× magnification.

The present invention metallizes ferrite materials by surface reduction. Oxygen is removed from the ferrite, leaving the metallic constituents to form conductive regions on the ferrite surface. The ferrite materials are selected from hard and soft ferrites. Exemplary hard ferrite materials are barium ferrites $BaO \cdot 6Fe_2O_3$ and strontium ferrites $SrO \cdot 6Fe_2O_3$ while exemplary soft ferrite materials are nickel-zinc ferrites $(Ni_xZn_{(1-x)}Fe_2O_4)$ and manganese-zinc ferrites $(Mn_xZn_{(1-x)}Fe_2O_4)$ where x is between 0 and 1. Optionally, the ferrite materials may include dopants for enhancing electrical and/or magnetic properties such as $Co_2O_3$ or dopants for enhancing the sintering behavior of the ferrite.

Substrates are made from the ferrite material through any suitable forming technique. Typically, a slurry of the ferrite powder, optionally mixed with other ferrites or other ceramic materials, is formed by mixing with organic binders. The slurry is cast into a tape by a doctor blade process. The tape is cut and laminated to form desired three-dimensional configurations, followed by firing to form the sintered ceramic substrate.

To perform the surface reduction treatment, the ceramic surface is heated and contacted with a gaseous reducing agent. The heat treatment is performed in any heating chamber; typically, a furnace is employed. For nickel-zinc ferrites, heat treatment temperature is in the range of 100°–800° C., preferably 250°–500° C. For manganese-zinc ferrites, heat treatment temperature is in the range of 200°–1000° C., preferably 300°–800° C., and even more preferably 400°–600° C. Lower temperatures are kinetically undesirable, while higher temperatures can result in dimensional distortion, thermal stresses and higher processing costs. For both types of ferrites, heat treatment time in the presence of the reducing agent is in the range of 0.01 to 1000 hours, preferably 0.1 to 100 hours, and more preferably 0.2 to 50 hours.

Heat treatment times and temperatures for other ceramic compositions depend on the nature of the specific materials, particularly, the affinity of the metal cations for the oxygen anions. This affinity determines the ease with which oxygen is removed from the surface. For the oxides included in ferrites, oxides of nickel, copper, and iron are preferentially reduced over oxides of zinc, manganese, and barium, especially in the temperature range of 600° C. or lower.

The ceramic surface at the elevated temperature is contacted with a gaseous reducing agent for removal of oxygen from the ferrite material. Exemplary gaseous reducing agents include hydrogen, hydrogen/nitrogen mixtures (e.g., forming gas), hydrogen/inert gas mixtures (e.g., hydrogen/helium, hydrogen/argon), ammonia, ammonia/nitrogen mixtures, and ammonia/inert gas mixtures. However, any gas or mixture of gases which removes oxygen from the ferrite surface can be employed.

The reducing agent combines with the ceramic anion and is volatilized, leaving behind the cation portion of the ceramic. For ferrites, the anion is oxygen which combines with hydrogen to form $H_2O$. Surprisingly, the inventive technique creates a uniformly-advancing conductive layer without undesirable inhomogeneities such as grain boundary metallization. Exemplary conductive layer thicknesses vary less than about 30% of the average layer thickness value.

The as-reduced conductive region of the ceramic typically has resistivities in the range of 100–10,000 $\mu\Omega$-cm. To create surfaces with higher conductivities, additional metal is optionally plated on the reduced surface layer. Additional plating is performed using electroless or electrolytic techniques, such as with copper, nickel, or solder alloy plating baths. The conductivity of the as-reduced layer is sufficiently high for electroplating. Electrolytic plating is exemplary in view of the low cost, high plating speed, and reduced need to dispose of the spent chemicals. Through the use of an additional plating treatment, a multilayer metallization structure is formed. This multilayer metallization structure comprises the ceramic ferrite substrate, the thermally-reduced layer formed from the ferrite, and the plated layer formed on the thermally-reduced layer. The resistivity of the metallized layer thus formed is typically less than 50 $\mu\Omega$-cm, with resistivities of less than 10 $\mu\Omega$-cm being exemplary.

Optionally, a further heat treatment is performed on the ceramic surface in the absence of a reducing gas. This heat treatment may be performed in situ immediately following the reduction treatment, or it may be performed following removal of the ceramic substrate from the reduction treatment site. The non-reducing heat treatment is conducted in a nitrogen or inert gas (e.g., argon, helium) atmosphere. When performing the non-reducing heat treatment in situ, the reducing gas is first removed by vacuum pumping or flushing. The heat treatment is performed in the range of 100°–1000° C., preferably 200°–800° C., and more preferably, between 300°–700° C. Heat treatment times are from 0.01 to 1000 hours, preferably 0.1 to 100 hours. The heat treatment following surface reduction is applicable not only to ferrite ceramics, but to any ceramic material whose surface is made conductive through removal of anion constituents. This includes ceramics based on oxides, nitrides, carbides, and combinations thereof.

The additional heat treatment following surface reduction has been found to dramatically improve the adhesion of the reduced conductive layer to the matrix ferrite. While the exact mechanism of enhanced adhesion is not known, it is believed that the non-reducing heat treatment allows rearrangement of anions, such as oxygen atoms, at the interface between the reduced region and the ferrite matrix. This rearrangement creates an adhesion-promoting graded interface between the reduced region and the ferrite. The graded interface comprises partially-reduced ferrite and unreacted ferrite. Enhanced metallization adhesion due to the additional heat treatment results in metallization pull strengths of at least 10% and, more preferably, at least 30% of the fracture strength of the ceramic material.

The following Examples illustrate surface reduction treatments, post-treatment to enhance adhesion of the reduced layer, and electroplating of thermally-reduced surface regions:

EXAMPLE 1

Figure 2:
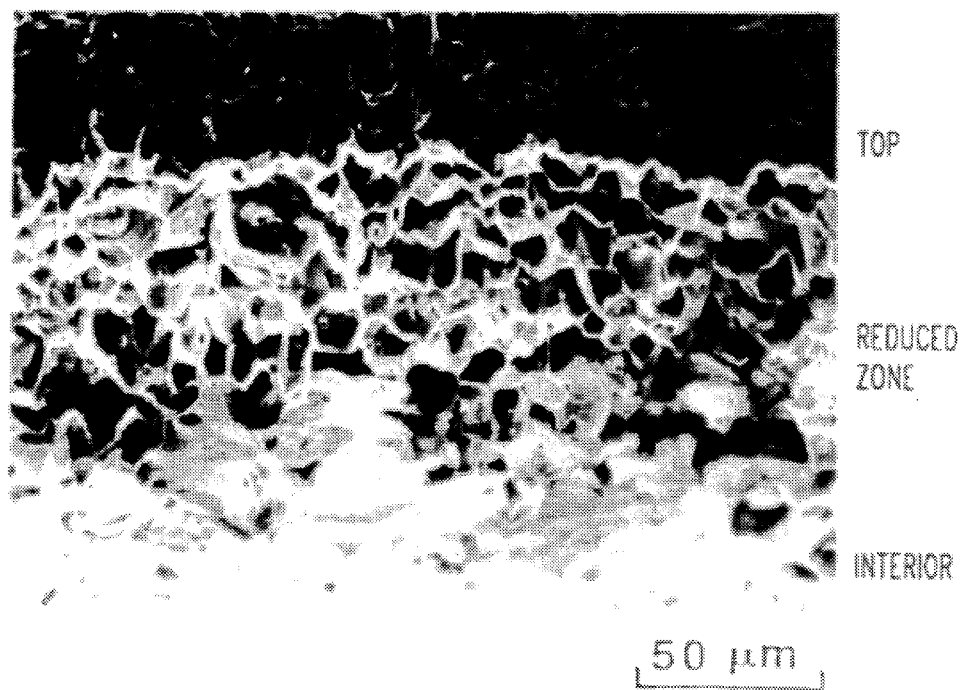
FIG. 2 is a scanning electron photomicrograph of the Ni-Zn ferrite sample of FIG. 1 at 500× magnification.

A Ni-Zn ferrite sample (0.5"×0.5"×0.05" size) was heat-treated in flowing hydrogen. The heat treatment consisted of heating from room temperature to 350° C. in 30 min., holding it at 350° C. for 10 min. and furnace cooling. The electrical resistance on the surface of the sample when measured at ~0.125" distance was changed by the heat treatment from >20 M$\Omega$ to ~4 $\Omega$. A scanning electron microscopy of the fracture surface indicates that about ~60 $\mu$m depth of the surface region was uniformly reduced from oxide to metal-containing conductive layer as shown in FIGS. 1 and 2.

EXAMPLE 2

A Ni-Zn ferrite sample was processed similarly as in Example 1 except that the heat treatment atmosphere was flowing forming gas (85% $N_2$ +15% $H_2$). The electrical resistance when measured as in Example 1 (0.125" between the two probes) was ~50 ohm.

An adhesion test for the conductive film obtained by the heat treatment was carried out by using an adhesive tape test. The adhesion was relatively low with the reduced layer partially removed from the ferrite substrate by the tape. The adhesion is estimated to be less than a pull strength of 500 pounds per square inch (or 0.5 ksi).

EXAMPLE 3

A Ni-Zn ferrite sample was heat treated in a forming gas (~15% $H_2$) similarly as in Example 2 except that an additional heat treatment at a higher temperature (550° C. for 15 min.) was given in the absence of hydrogen by promptly switching to continuously flowing nitrogen gas right after the Example 2 treatment. The electrical resistance measured was ~75 Ω. This sample was electroplated with copper (~10 μm thick) from a commercial bath, CUPRACID BL (Atotech, State College, Pa.). Six adhesion measurements (by epoxy bonding of a 0.14" dia. aluminum stud onto the surface of the reduced and plated ferrite and tested under tensile load) were made and are shown in Table I. The adhesion strength is significantly enhanced compared with the similarly reduced sample without the post-reduction heat treatment. It is noteworthy from Table I that some samples after the post-reduction heat treatment exhibited fracture failure within the ferrite matrix itself as opposed to the metal-ferrite interface. Such matrix fracture indicates extremely strong interface bonding.

Adhesion is further increased when the surface of the reduced Ni-Zn ferrite sample is plated with nickel prior to copper plating. A sample prepared under the same conditions of hydrogen reduction and subsequent adhesion improvement processing as above was plated with 2.5 μm of nickel, 7.5 μm of copper and then 2.5 μm of nickel. The pull strengths are even higher than the Cu-plated ferrite samples as shown in Table I. The predominant failure mode for this sample is within the ferrite matrix due to strong interface bonding.

TABLE I

Comparative Pull Strengths of Ferrite Sample
After Surface Reduction Heat Treatment and Electroplating

| Sample Treatment | Pull Strength* (ksi) | Predominant Failure Location |
| --- | --- | --- |
| As-reduced + Cu Plated | <0.5 | Interface Between Cu and Reduced Ferrite or Interface Between Reduced Ferrite and Matrix Ferrite |
| Reduced + Post Heat Treated + Cu Plated | 2.5 | Reduced Ferrite/Matrix Interface or Within Ferrite Matrix |
| Reduced + Post Heat Treated + Ni Plated | 6.4 | Within Ferrite Matrix |

*Average of at least 6 measurements.

EXAMPLE 4

Figure 3:
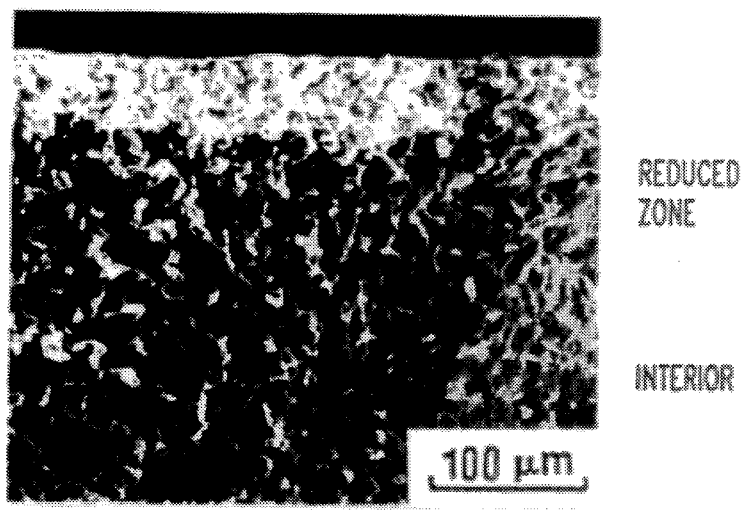
FIG. 3 is a scanning electron photomicrograph of a hydrogen-reduced Mn-Zn ferrite sample in cross-section taken at 200× magnification.
Figure 4:
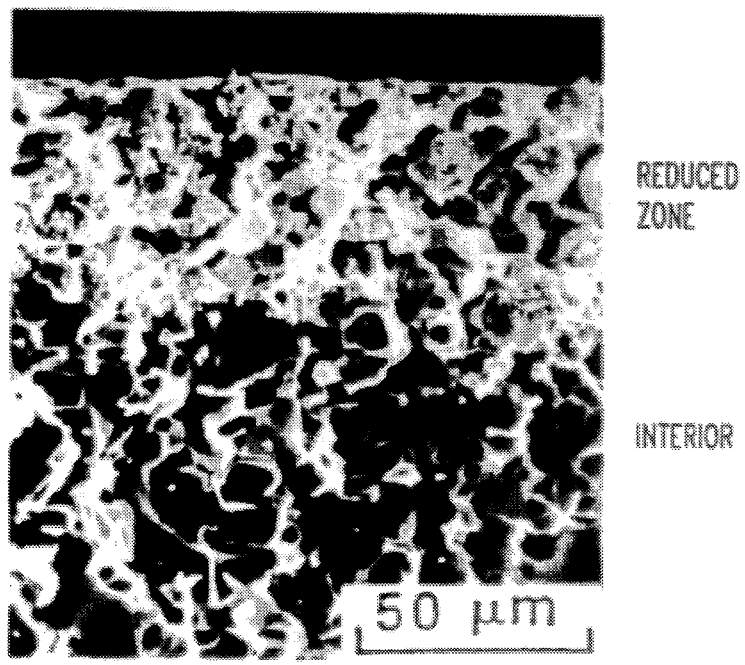
FIG. 4 is a scanning electron photomicrograph of the Mn-Zn ferrite sample of FIG. 3 at 600× magnification.

A Mn-Zn ferrite sample was heat treated by heating in flowing $H_2$ to 550° C. in 30 min, holding for 10 min at 550° C. and furnace cooling. The surface resistance was reduced from 3.4 kΩ in the as received ferrite to ~0.6Ω after heat treatment. The conductive layer on the surface is shown in the scanning electronmicrographs of FIGS. 3 & 4.

EXAMPLE 5

A Mn-Zn ferrite sample (0.5"×0.5"×0.05" size) was processed in a flowing forming gas (15% $H_2$ in $N_2$). The sample was heated to 500° C. in 30 min. and held for 1h at 500° C. The surface resistance was ~1 Ω. The sample was plated with 2.5 μm nickel and 7.5 μm copper. The pull strength was 4.8 kpsi and the substrate break-out was the predominant adhesion failure mode.

EXAMPLE 6

A barium ferrite sample was processed as in Example 5. The surface electrical resistance was reduced from 100 kΩ in the as-received ferrite to ~1Ω after heat treatment.

Figure 5:
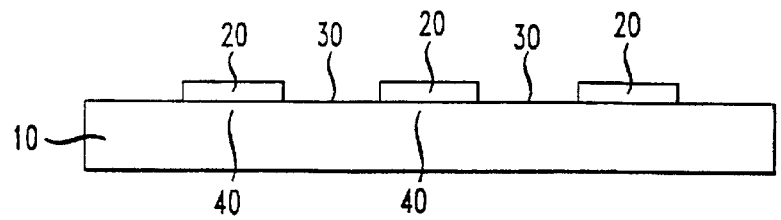
FIG. 5 is a schematic cross-sectional view of a ferrite substrate with a patterned mask structure.

In another aspect, the present invention provides a surface metallization treatment which forms patterned conductive regions on a ferrite material. When desiring to metallize only selected portions of a substrate, masking material is deposited on the surface of the ceramic to prevent or minimize contact of the ferrite by the gaseous reducing agent. As illustrated in FIG. 5, masking material 20 is deposited on regions 40 of ferrite substrate 10 to expose regions 30 to be metallized. Masking material 20 is selected from oxides, nitrides, carbides, glasses, polymers, and metals. Exemplary mask materials are aluminum, aluminum oxide, zinc oxide, polyimides, sodium silicate, and materials with low hydrogen/oxygen diffusion rates. The masking material is applied through a variety of deposition techniques such as sputtering, plasma spraying, laser ablation and evaporation. For oxide mask materials, the oxide is directly deposited or the cation constituents of the oxide are deposited followed by reaction to form the oxide. Alternatively, the oxide is deposited reactively, through vaporizing or sputtering a metal source in an oxygen-containing atmosphere. Aluminum oxide and zinc oxide are exemplary mask materials formed using these techniques.

Low melting point oxides or glasses are deposited by spray coating or screen printing, or brush painting through a patterned mask, followed by fusion to form a continuous layer. These materials are deposited on the unfired substrate followed by co-firing to form the masked substrate, or deposited on a fired ceramic substrate.

Water-soluble compounds such as sodium silicate or salt solutions (e.g., oxide precursors formed as salt solutions) are applied as viscous liquids, dried, and fired to form the masking material. Solvent-soluble compounds such as high-temperature-resistant polymers, e.g., polyimides, are deposited as a continuous layer followed by photolithographic patterning to define the regions of the ferrite to be metallized.

Figure 6:
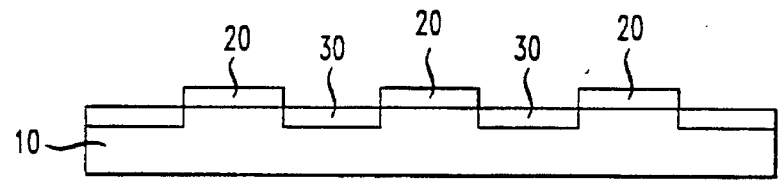
FIG. 6 is a schematic cross-sectional view of the structure of FIG. 5 following thermal reduction treatment.
Figure 7:
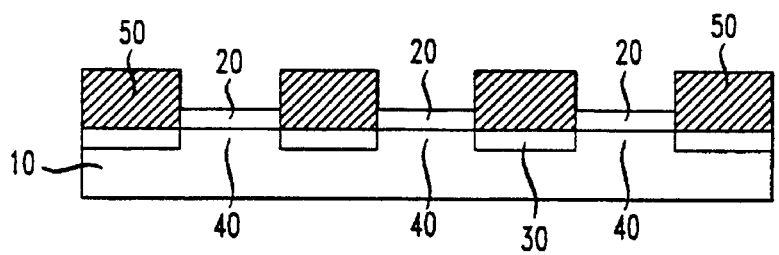
FIG. 7 is a schematic cross-sectional view of the structure of FIG. 6 following electroplating.

Following deposition of the masking material 20, regions 30 are thermally reduced, as shown in FIG. 6. A further metal layer 50 is optionally deposited, e.g., by electroplating, as illustrated in FIG. 7. Masking material 20 is optionally removed through suitable chemical or mechanical techniques following the thermal reduction treatment or following the deposition of layer 50.

Figure 8A:
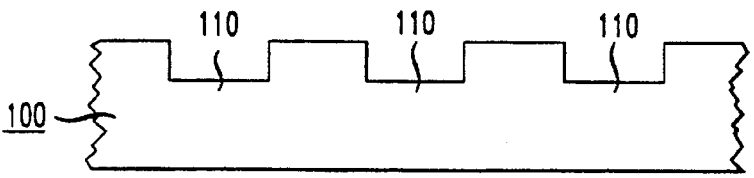
FIG. 8A is a schematic cross-sectional view of a grooved ferrite substrate.
Figure 8B:
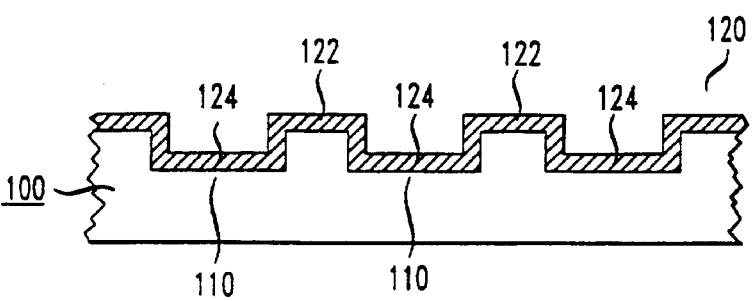
FIG. 8B is a schematic cross-sectional view of the grooved ferrite substrate of FIG. 8A with a thermally-reduced conductive surface layer.
Figure 9:
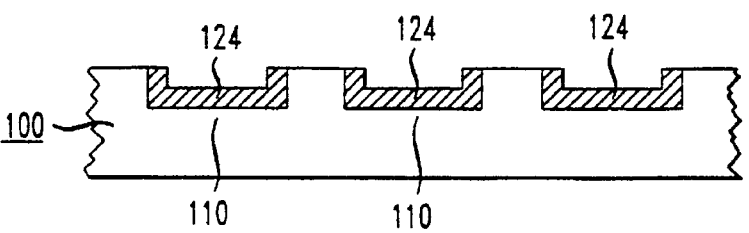
FIG. 9 is a schematic cross-sectional view of the grooved ferrite substrate of FIG. 8B after mechanical polishing.

An alternate embodiment for conductive patterning of ferrite substrates is illustrated in FIGS. 8 and 9. This technique utilizes multilayer ceramic technology to construct ferrite substrate geometries which facilitate removal of portions of the reduced ferrite surface. In FIG. 8A, green sheets of ferrite material, e.g., formed through tape casting or other suitable methods, are configured to create surface grooves 110 in a ferrite substrate 100.

In FIG. 8B, the entire surface region of the ferrite substrate has been reduced to form conductive layer 120. Conductive layer 120 comprises portions 122 formed on the surface of substrate 100 and portions 124 formed within grooves 110. To create conductive regions only within grooves 110, surface portions 122 of the conductive layer are removed, typically through a mechanical grinding operation. FIG. 9 illustrates grooves 110 with conductive portions 124 formed in this manner. Because of the surface geometry formed through multilayer ceramic technology, the removal of conductive portions 122 can be performed through a single, blanket-grinding step. Conductive portions 124 formed in grooves 110 are optionally plated through electroless or electrolytic techniques, as previously discussed.

The following Examples illustrate the use of various masking materials to define regions to be metallized:

EXAMPLE 7

A sodium silicate solution (commonly known as water glass) containing ~27% $SiO_2$ and ~14% NaOH was left open to air for 16 h to partially dry the solution and increase its viscosity. The solution was painted on a Ni-Zn ferrite sample with a composition of $(Ni_{0.32}Zn_{0.58}Cu_{0.12})Fe_{1.97}O_4$, to expose three horizontal stripes (0.32 cm wide×0.75 cm long, 0.50 cm apart). The coated ferrite was baked at 40° C. to harden the coating, followed by thermal reduction by heating in 30 min to 390° C./45 min in 15% $H_2$+85% $N_2$ forming gas. The furnace was then vacuum pumped and back-filled with $N_2$ gas, and the ferrite was further heat treated by raising the temperature to 550° C. for 15 min. followed by furnace cooling.

The electrical resistance measured in the exposed and reduced stripe regions was ~10–50Ω. The resistance in the masked regions between the stripes was ~3 MΩ.

EXAMPLE 8

0.4 gm of chromic acid ($CrO_3$) was mixed with 0.1 g of $H_2O$ to form a paste-like solution which was painted on a Ni-Zn ferrite sample as in Example 7. After drying and melting the chromic acid coating by heating in air to ~300° C., the ferrite sample was reduced in forming gas at 390° C. for 30 min. followed by post-reduction heat treatment in nitrogen at 550° C. for 15 min. The surface resistance in the exposed region was ~200–500Ω while surface resistance in the masked regions was greater than 20 MΩ.

EXAMPLE 9

A layer of ZnO, about 50–100 μm thick, was deposited as a mask on a Ni-Zn ferrite sample having the composition of Example 7. The deposition was carried out reactively by passing evaporated Zn through oxygen gas onto a masked ferrite sample. After thermal reduction processing as in Example 7, the surface resistance in the exposed region was ~300 Ω while that in the masked region was about 20 kΩ.

EXAMPLE 10

The surface of a Ni-Zn ferrite sample, ~1 inch×2 inch× 0.050 inch thick, was patterned using a polyimide layer. A polyimide solution (Hitachi #3400) was spin coated at 3000 rpm to ~9 μm thickness, and soft baked at 100° C. for 8 minutes. On top of the polyimide layer, a photoresist solution (Shipley #4620) was spin coated at 2500 rpm, and soft baked at 100° C. for 1.5 minutes. The photoresist was exposed to light through a mask and developed with diluted AZ 400K solution while simultaneously etching the polyimide layer. The photoresist was stripped with N-butyl acetate, followed by rinsing with isopropyl alcohol. The patterned polyimide on the ferrite surface was cured at 400° C./30 minutes. The cured polyimide layer was ~5 μm thick.

Figure 10:
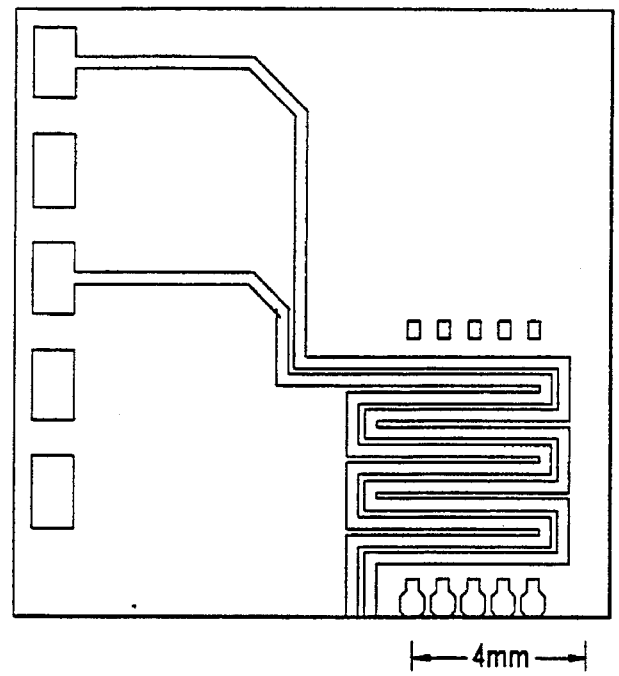
FIG. 10 is a photomicrograph of a ferrite substrate covered with a photolithographically-patterned polyimide layer following thermal reduction and copper plating.

The ferrite sample was then subjected to a surface reduction heat treatment of 390° C. for 45 minutes in forming gas followed by an adhesion-improvement heat treatment of 450° C. for 16 hours in a nitrogen atmosphere. The exposed regions exhibited a surface resistance at 0.125 inch distance of ~18 Ω while the polyimide covered region showed a high surface resistance of ~300 KΩ. Electroplating of copper (~5 μm thick) was performed by connecting two conductive thermally reduced paths to an electrode while immersed in a copper plating solution. The Cu-plated paths are shown in the photomicrograph of FIG. 10. The conductive paths thus prepared have low electrical resistance of ~0.5 Ω along the total length shown in FIG. 10.

Figure 11:
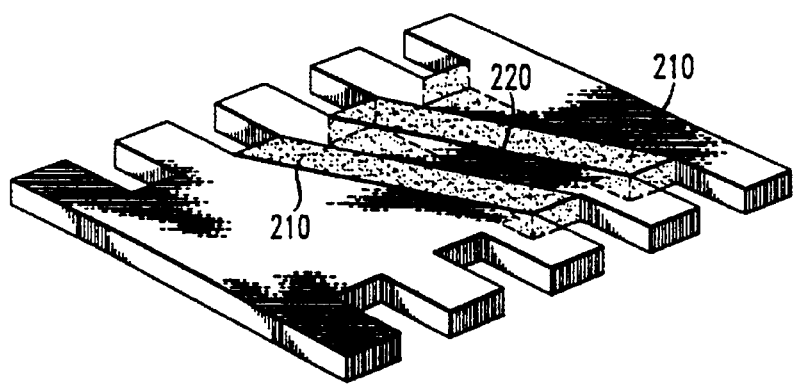
FIG. 11 is a schematic perspective view of an inductor constructed using a helical conductive path of thermally-reduced ferrite.
Figure 12:
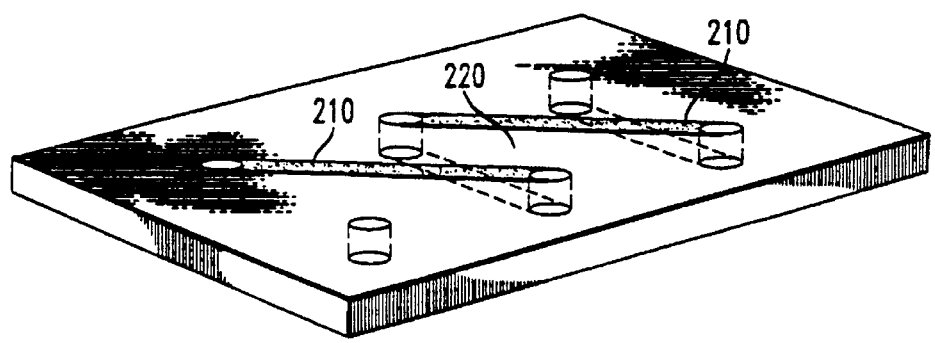
FIG. 12 is a schematic perspective view of an inductor formed using a conductive path of thermally-reduced ferrite.

In a further aspect, the present invention provides a technique for metallizing ferrites for devices such as inductors and transformers. To form inductors and transformers, three dimensional conductive paths are defined on ferrite substrate to create windings surrounding a ferrite core. As schematically illustrated in FIGS. 11 and 12, ferrite-core inductors are formed by locally masking the substrate to define a three-dimensional helical paths 210 surrounding ferrite cores 220. The exposed paths are metallized by surface reduction, as described above. An electrolytic copper layer is added to increase the winding thickness.

Figure 13:
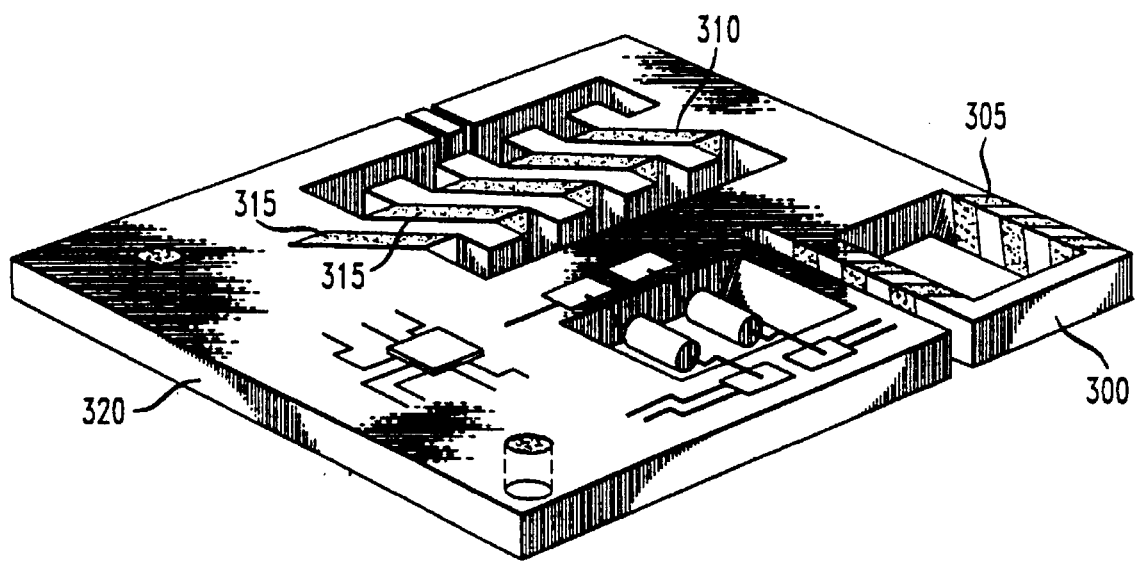
FIG. 13 is a schematic perspective view of a power converter having conductive regions formed according to the present invention.

In FIG. 13, metallized regions are defined according to the present invention to create magnetic devices which are integrated into a substrate for circuit formation. Such a configuration is described in co-pending U.S. application Ser. No. 08/428,283, to Fleming et al (Fleming 8-31-14-11-20) and assigned to the present assignee, the disclosure of which is incorporated by reference herein. In the AC-DC power converter of FIG. 13, transformer 300 and inductor 310 are formed by surface reduction of a ferrite substrate patterned to define winding regions 305 and 315, respectively. The portions of the ferrite substrate 320 which do not form core elements for these devices are used as an insulating substrate to support other components of the power converter.

Figure 14:
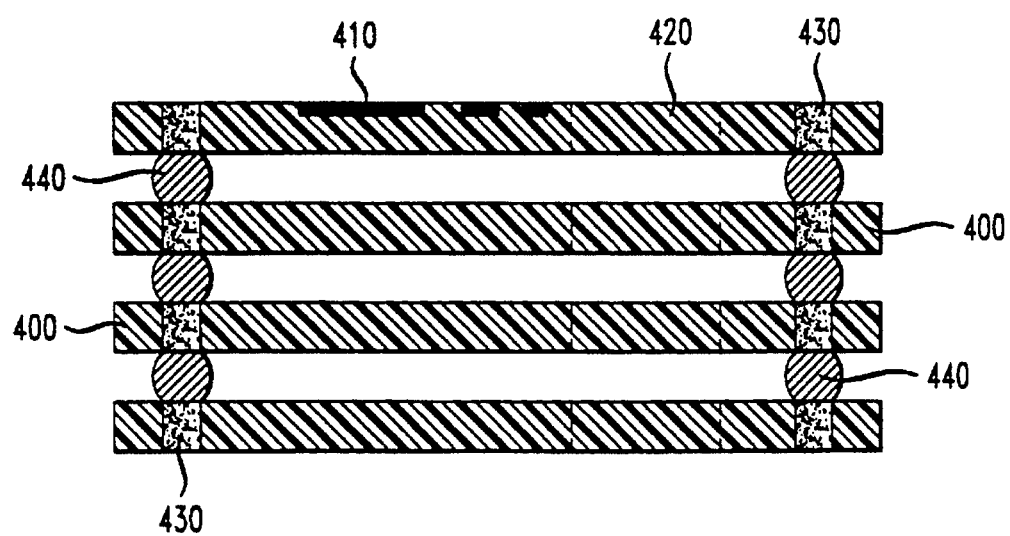
FIG. 14 is a schematic cross-sectional view of a multi-layer power converter having conductive regions formed according to the present invention.

Multilayer devices, such as that shown in FIG. 14 are also formed according to the present invention. Multiple ferrite substrates 400 having circuit paths 410 and magnetic devices such as inductors 420 are stacked. Conductive vias 430 having conductive surfaces formed by surface reduction are connected to adjacent levels by soldered regions 440.

While the foregoing invention has been described with reference to the various embodiments, modifications and changes thereto may be made. Accordingly, modifications and changes, such as those suggested above, but not limited thereto, are considered to be within the scope of the claims.

We claim:

1. A ferrite device comprising:
   a ferrite substrate having a first composition including at least two metal elements in a first ratio and oxygen; and
   a metallized surface region integral with said ferrite substrate and having a second composition including said at least two metal elements in said first ratio but differing from said first composition with respect to oxygen, at least a portion of said metallized region being formed from at least a portion of said ferrite substrate, said metallized surface region comprising a reduced portion of the ferrite substrate.

2. A ferrite device according to claim 1 wherein the metallized surface region is patterned to create conductive windings and the ferrite substrate is positioned as the core of the conductive windings.

3. A ferrite device according to claim 2 wherein the windings define an inductor.

4. A ferrite device according to claim 2 wherein the windings define a transformer.

5. A ferrite device according to claim 1 further comprising a deposited metal layer on said metallized surface region.

6. A ferrite device according to claim 5 wherein the deposited metal layer is selected from copper, nickel, and zinc.

7. The apparatus as recited in claim 1 further comprising a graded interface formed between the ferrite substrate and the metallized surface region and integral therewith, the graded interface comprising partially-reduced ferrite and unreacted ferrite.

* * * * *